United States Patent
Iida

(10) Patent No.: US 6,902,618 B2
(45) Date of Patent: Jun. 7, 2005

(54) SILICON SINGLE CRYSTAL WAFER HAVING VOID DENUDED ZONE ON THE SURFACE AND DIAMETER OF ABOVE 300 MM AND ITS PRODUCTION METHOD

(75) Inventor: Makoto Iida, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/344,423

(22) PCT Filed: Jun. 7, 2002

(86) PCT No.: PCT/JP02/05692

§ 371 (c)(1),
(2), (4) Date: Feb. 12, 2003

(87) PCT Pub. No.: WO02/103901

PCT Pub. Date: Dec. 27, 2002

(65) Prior Publication Data

US 2003/0172865 A1 Sep. 18, 2003

(30) Foreign Application Priority Data

Jun. 15, 2001 (JP) ......................................... 2001-181587

(51) Int. Cl.[7] .............................................. C30B 15/00
(52) U.S. Cl. .............................. 117/20; 117/13; 117/19; 423/328.2
(58) Field of Search ............................... 117/13, 14, 15, 117/19, 20; 423/328.2

(56) References Cited

U.S. PATENT DOCUMENTS 5,935,320 A   8/1999   Graef et al. ................... 117/2
5,954,873 A   9/1999   Hourai et al. .................. 117/13
6,228,164 B1  5/2001   Ammon et al. ................ 117/19

FOREIGN PATENT DOCUMENTS

| EP | 0962556 A1 | 12/1999 |
| EP | 0964082 A1 | 12/1999 |
| EP | 1 195 455 | 4/2002 |
| JP | 2000-344598 | 12/2000 |
| JP | 2001-064095 | 3/2001 |

OTHER PUBLICATIONS

F. Dupret et al., "Global Modelling of Heat Transfer in Crystal Growth Furnaces", Int. J. Heat Mass Transfer, vol. 33, No. 9, pp. 1849–1871, 1990.

*Primary Examiner*—Felisa Hiteshew
(74) *Attorney, Agent, or Firm*—Hogan & Hartson, LLP

(57) ABSTRACT

The present invention provides a silicon single crystal wafer having a diameter of 300 mm or more and having a defect-free layer containing no COP for a depth of 3 μm or more from a surface and a method for producing a silicon single crystal, wherein, when a silicon single crystal having a diameter of 300 mm or more is pulled with nitrogen doping by the CZ method, the crystal is grown with a value of V/G [mm$^2$/K·min] of 0.17 or less, where V [mm/min] is a pulling rate, and G [K/mm] is an average of temperature gradient in the crystal along a pulling axis from the melting point of silicon to 1400° C. Thus, there are established conditions for pulling a silicon single crystal and conditions for heat treatment of wafer for obtaining a silicon single crystal wafer having a defect-free layer free from COP for a sufficient depth of the surface layer by pulling a silicon single crystal having a diameter of 300 mm or more, processing the crystal into wafers and subjecting the wafers to the heat treatment.

6 Claims, No Drawings

SILICON SINGLE CRYSTAL WAFER HAVING VOID DENUDED ZONE ON THE SURFACE AND DIAMETER OF ABOVE 300 MM AND ITS PRODUCTION METHOD

TECHNICAL FIELD

The present invention relates to a silicon single crystal wafer having a diameter of 300 mm or more and a highly functional defect-free layer and a method for producing the same.

BACKGROUND ART

Silicon wafers produced by processing a nitrogen-doped silicon single crystal produced by the Czochralski method (CZ method) into wafers and then subjecting the wafers to heat treatment (it may be called annealing) at a high temperature for a long period of time in an inert gas atmosphere such as argon are recently attract attentions as products of which gettering ability for metal impurities and so forth is enhanced by increasing integrity of device active layer at wafer surface to make a region of at least about 3 μm from the surface defect-free, which is required for the device fabrication, and increasing density of oxide precipitates in the bulk, called BMD (Bulk Micro Defect) and serving as gettering sites.

Although the current mainstream of products applied with this technique is constituted by wafers having a diameter of 200 mm or less, it is attempted to apply this technique to wafers having a diameter of 300 mm currently under development, and it is estimated that demands for wafers having a diameter of 300 mm or more will be increasingly expanded in future.

However, cooling of a pulled crystal having a diameter of 300 mm or more does not advance easily, because a pulling apparatus used for the production thereof has a quite large volume and thus a large heat capacity and because of influence of specific heat. It has been revealed that, because of the above, the size of void defects (also called COP) in the silicon single crystal becomes larger, and the void defects can be eliminated only from a surface layer of an extremely small thickness with the standard conditions for the subsequent annealing (1200° C., 1 hour, argon atmosphere) even for a nitrogen-doped single crystal wafer.

Although the phenomenon that cooling of a crystal does not advance easily was similarly observed upon the alternations of generations in the past for wafer diameter (for example, upon the turning point of diameter from 150 mm to 200 mm), the influences thereof were not so significant compared with those of marked increases of volume of pulling apparatus and crystal volume at the time of the expansion of the diameter from 200 mm to 300 mm, and as a result, the void defects could be eliminated for a sufficient depth (at least 3 μm) with the conventional standard annealing conditions (1200° C., 1 hour, argon atmosphere).

Further, the so-called grown-in defects introduced upon pulling of crystals have been actively studied from only several years ago for the first time. At that time, wafers having a diameter of 300 mm were not produced at a mass production level at all and production of a sample of that shape was just became possible during that period. Therefore, it was not conceived to eliminate grown-in defects by annealing of wafers having a diameter of 300 mm, and there has hitherto been much less expected the phenomenon that the elimination of grown-in defects by annealing of wafers having a diameter of 300 mm becomes much more difficult compared with that for wafers having a diameter of 200 mm.

DISCLOSURE OF THE INVENTION

Thus, the present invention was accomplished in order to solve the aforementioned problems, and the main object of the present invention is to establish conditions for pulling a silicon single crystal and conditions for heat treatment of wafers for obtaining a silicon single crystal wafer having a defect-free layer free from COP for a sufficient depth of the surface layer by pulling a silicon single crystal having a diameter of 300 mm or more, processing the crystal into wafers and subjecting the wafers to the heat treatment.

In order to achieve the aforementioned object, the silicon single crystal wafer of the present invention is a silicon single crystal wafer having a diameter of 300 mm or more and having a defect-free layer containing no COP for a depth of 3 microns or more from a surface.

Thus, according to the present invention, there can be provided a heat-treated silicon single crystal wafer showing superior crystallinity and high quality, which is a silicon single crystal wafer actually having a diameter of 300 mm or more and having a defect-free layer containing no COP for a depth of 3 microns or more-from a surface.

Further, the method for producing a silicon single crystal of the present invention is characterized by, when a silicon single crystal having a diameter of 300 mm or more is pulled with nitrogen doping by the Czochralski method, growing the crystal with a value of V/G [mm$^2$/K·min] of 0.17 or less, wherein V [mm/min] is a pulling rate, and G [K/mm] is an average of temperature gradient in the crystal along a pulling axis from the melting point of silicon to 1400° C.

If a crystal is grown with nitrogen doping and controlling V and G so that the value of the parameter V/G should become 0.17 or less when the silicon single crystal having a diameter of 300 mm or more is pulled, it becomes possible to reduce the COP size, and if heat treatment is conducted thereafter, there can be obtained a silicon single crystal with which the depth of the surface defect-free layer can be surely made deeper. In addition, in order to avoid marked reduction of the productivity due to reduction of the pulling rate, the value of V/G must be 0.1 or more, and if it is 0.13 or more, fine dislocations in the pulled crystal, if any, can be eliminated by the subsequent annealing. Further, the value is more preferably 0.146 or more, since such a value makes it possible to make the pulled crystal completely dislocation free.

In the aforementioned method, the crystal is preferably grown with a nitrogen concentration of $1 \times 10^{13}/cm^3$ or more for the nitrogen doping.

If a high nitrogen concentration is used as described above, the depth of the defect-free layer containing no COP at the surface of the wafer can be made much deeper, and at the same time, BMDs in the bulk can be increased to produce a wafer having sufficient IG ability.

Furthermore, the method for producing a silicon single crystal wafer of the present invention is characterized by, in a method for producing a silicon single crystal wafer in which a nitrogen-doped silicon single crystal wafer having a diameter of 300 mm or more is subjected to heat treatment, subjecting the wafer to the heat treatment at 1230° C. or more for 1 hour or more under an atmosphere of inert gas, hydrogen or a mixed gas thereof.

As for a silicon single crystal wafer having a diameter of 300 mm or more, if it is subjected to the heat treatment at 1230° C. or more for 1 hour or more under an atmosphere of inert gas, hydrogen or a mixed gas thereof as described above, a defect-free layer containing no COP can be formed for a depth of 3 μm or more from the wafer surface, and thus a highly functional heat-treated silicon single crystal wafer of high quality can be produced.

The method for producing a silicon single crystal wafer of the present invention is characterized by, in particular, subjecting a silicon single crystal wafer obtained by slicing a silicon single crystal produced by the method in which nitrogen is doped and V/G is controlled to be not larger than the predetermined value as described above to the heat treatment defined above. According to such a production method, a defect-free layer containing no COP can be surely formed for a depth of 3 μm or more from the wafer surface in a silicon single crystal wafer having a diameter of 300 mm, and thus a highly functional heat-treated silicon single crystal wafer of high quality can be produced.

As explained above, according to the present invention, a low V/G value is employed as a condition for pulling a silicon single crystal and high temperature annealing is employed as a condition for heat treatment of the wafer for obtaining a silicon single crystal wafer having a defect-free layer containing no COP as a surface layer by subjecting a silicon single crystal wafer having a diameter of 300 mm or more to the heat treatment, and thereby a highly functional heat-treated silicon single crystal wafer of high quality, in which the depth of the defect-free layer containing no COP is 3 μm or more, can be produced at a low cost.

BEST MODE FOR CARRYING OUT THE INVENTION

Although the present invention will be explained in more detail hereafter, the present invention is not limited to these explanations.

In order to establish a method for producing a silicon single crystal wafer having a diameter of 300 mm or more and having a defect-free layer containing no COP as a surface layer for a sufficient depth by subjecting the wafer to heat treatment, the inventors of the present invention eagerly conducted investigations and experiments about silicon single crystal pulling conditions and wafer heat treatment conditions to determine various conditions for the method, and thus accomplished the present invention.

COP (Crystal Originated Particle) is a defect (void) formed by aggregation of vacancies, which are point defects, and causes degradation of oxide dielectric breakdown voltage of a wafer. It is selectively etched by SC-1 cleaning (cleaning with a mixture of $NH_4OH:H_2O_2:H_2O=1:1:10$) of a wafer, and revealed as a pit. This pit has a diameter of 1 μm or less, and detected by the light scattering method.

Further, if a recent test apparatus of high sensitivity based on the light scattering method is used, it can be detected without any treatment for revealing it such as SC-1 cleaning.

As described above, in growing of a silicon single crystal having a diameter of 300 mm or more, cooling rate of the crystal becomes small, thus aggregation of vacancies advances, size of COPs become larger, and thus COPs come to be hardly eliminated by annealing.

Therefore, in order to obtain a sufficient depth of a defect-free layer containing no COP at the wafer surface after annealing in a silicon wafer having a diameter of 300 mm or more, there are conceived two types of means, i.e., (1) making the COP size small, and (2) using higher heat treatment temperature and longer heat treatment time.

Therefore, it was first planned to examine the possibility of reduction of COP size by rapidly cooling a crystal having a diameter of 300 mm (diameter of 12 inches) to suppress aggregation of vacancies, and rapid cooling was attempted for the temperature range around 1100° C., which is a defect aggregation temperature range, by converting HZ (Hot Zone: internal structure of furnace).

However, since the heat capacity of the pulling apparatus was large from the first, a cooling rate of 1.5 to 1.7° C./min was an upper limit, and dramatically rapid cooling (rapid cooling providing satisfactory COP size) could not be attained.

Then, reduction of the COP size was attempted by changing the pulling rate V [mm/min] or improving distribution in plane of the average G [K/mm] of the temperature gradient in the crystal along the pulling axis to control the value of V/G [mm²/K·min] as a parameter and thereby to control introduction of point defects.

V/G can be calculated by using FEMAG with consideration of HZ.

FEMAG is global heat transfer analysis software disclosed in literature (F. Dupret, P. Nicodeme, Y. Ryckmans, P. Wouters and M. J. Crochet, Int. J. Heat Mass Transfer, 33, 1849 (1990)).

As a result, the COP size became a satisfactory COP size of about 80 nm in average at last with a V/G value of 0.17 mm²/K·min or less, and a depth of 3 μm of the defect-free layer could be attained under the standard annealing conditions (1200° C., 1 hour, argon atmosphere). The nitrogen concentration at that time was $3 \times 10^{13}/cm^3$ to $10 \times 10^{13}/cm^3$.

The reason for such reduction of both of size and density of COPs by lowering the V/G value as described above can be considered as follows. That is, use of a smaller V/G value reduces difference of densities of vacancies, which are point defects, and interstitial silicons. Therefore, the amount of vacancies contributing to form voids by aggregation is decreased, and the aggregation temperature is lowered. Because of the lower aggregation temperature, vacancies of a small density become unlikely to aggregate, and thus size of voids becomes smaller. If the size of voids becomes smaller, unduly small voids are not detected and thus defect density is also reduced.

The measurement of the depth of the defect-free layer containing no COP was performed by forming a thermal oxide film on a surface of the produced wafer after polishing of the wafer for a predetermined depth from the surface and measuring TZDB (Time Zero Dielectric Breakdown) good chip yield of the thermal oxide film at various depths. The TZDB good chip yield shows good correlation with void defects (COPs), and it is known that, if void defects increase, the good chip yield decreases.

For the measurement of the TZDB good chip yield, a thermal oxide film having a thickness of 25 nm was formed on a wafer surface, a phosphorus (P)-doped polysilicon electrode (electrode area: 8 mm²) was further formed thereon, and the measurement was performed for 100 points on the wafer surface by using 1 mA/cm² of a current density in decision. A point showing a dielectric breakdown electric field of 8 MV/cm or more was determined as good chip, and good chip yield was calculated. A wafer showing a good chip yield of 95% or more was determined to be void-free.

Further, in order to reduce the COP size so that a depth of 3 μm or more of the defect-free layer containing no void defect should be obtained with standard annealing conditions by using a higher nitrogen concentration with standard crystal pulling conditions (V=1.1 mm/min, V/G=0.37 mm²/K·min), a nitrogen concentration of $8 \times 10^{14}/cm^3$ or more was required.

However, because of the relationship between the segregation coefficient and solid solubility limit of nitrogen, single crystallization of the pulled crystal became difficult with such a high concentration, and the yield of single crystal production was markedly reduced.

Then, with the same standard crystal pulling conditions and a nitrogen concentration ($3\times10^{13}/cm^3$) providing an average COP size of about 130 nm, it was attempted to improve the depth of the defect-free layer containing no void defect by controlling the annealing conditions.

As a result, a depth of 3 μm was obtained at last with annealing of 4 hours at an annealing temperature of 1200° C. However, since a method of using the heat treatment of such a long period of time invites increase of cost, it was attempted to increase the annealing temperature. As a result, a depth of 3 μm of the defect-free layer containing no void defect could be attained with annealing at a temperature increased to 1230° C. for 1 hour.

Furthermore, when reduction of COP size by the aforementioned decrease of the V/G value (0.17 mm²/K·min or less) and the use of a higher temperature of the heat treatment (1250° C., 1 hour) were combined, a depth of 6 μm or more of the defect-free layer containing no COP could be attained.

In addition, if a temperature of 1230° C. or more is used as the heat treatment condition, COPs in the surface layer can be eliminated with a higher temperature within a shorter time. However, the temperature must be below the melting point of silicon for a physical reason, and it is preferably 1350° C. or lower considering contamination of wafer and durability of furnace.

If the heat treatment time is 1 hour or longer, a deeper defect-free layer can be obtained. However, unduly long heat treatment time is wasteful, and therefore it is preferably 3 hours or shorter.

For the heat treatment used for the present invention, a heat treatment furnace of resistance heating type usually used for the heat treatment of wafers may be used. Such a heat treatment furnace of resistance heating type is a so-called batch type furnace, in which a plurality of wafers can be treated at one time, and a vertical type furnace and a horizontal type furnace can be generally mentioned. As the furnace of horizontal type, an apparatus such as UL-260-10H produced by Tokyo Electron, Ltd. can be mentioned.

In the heat treatment by using such a heat treatment furnace, a wafer obtained by slicing a single crystal grown with nitrogen-doping is subjected to the heat treatment at a temperature of 1230° C. or higher for 1 hour or longer under an atmosphere of inert gas such as argon, hydrogen or a mixed gas thereof. By using such heat treatment, a defect-free layer containing no COP can be formed for a depth of 3 μm or more from a surface of wafer.

Hereafter, the present invention will be explained with reference to the following examples. However, the present invention is not limited to these.

EXAMPLE

[Pulling of Single Crystal]

A predetermined amount of wafers having a nitride film were introduced into raw material polycrystal, and single crystals having a diameter of 300 mm were pulled with the following conditions. Common Condition: solid-liquid interface temperature gradient G: 2.94 K/mm Test 1: V=1.1 mm/min, V/G=0.37 mm²/K·min
Test 2: V=0.7 mm/min, V/G=0.24 mm²/K·min
Test 3: V=0.5 mm/min, V/G=0.17 mm²/K·min
Test 4: V=0.38 mm/min, V/G=0.13 mm²/K·min
Test 5: V=0.8 mm/min, V/G=0.27 mm²/K·min Based on calculation considering the amount of the nitride films of the introduced wafers having a nitride film, the amount of raw material polycrystal and segregation coefficient of nitrogen, wafers were sliced at a position of crystal showing a nitrogen concentration of $3\times10^{13}$ in Tests 1 to 4, and at a position of crystal showing a nitrogen concentration of $1\times10^{15}$ in Test 5. The wafers were subjected to heat treatment using a combination of the following heat treatment conditions. Subsequently, depth of a defect-free layer (COP free depth) on a surface of each wafer was obtained from the aforementioned TZDB good chip yield.

Heat treatment conditions (temperature/time): Four kinds of levels including 1200° C./1 Hr, 1200° C./4 Hr, 1230° C./1 Hr and 1250° C./1 Hr (all performed under 100% argon gas atmosphere).

The single crystal pulling conditions, heat treatment conditions mentioned above and the depths of the defect-free layers are summarized in Table 1.

TABLE 1

| | | Heat treatment conditions | | | |
|---|---|---|---|---|---|
| Test No. | Single crystal pulling conditions | Temperature = 1200° C. Time = 1 Hr | Temperature = 1200° C. Time = 4 Hr | Temperature = 1230° C. Time = 1 Hr. | Temperature = 1250° C. Time = 1 Hr |
| Test 1 | NC = $3 \times 10^{13}$, V = 1.10, V/G = 0.37 | D | C | C | B |
| Test 2 | NC = $3 \times 10^{13}$, V = 0.70, V/G = 0.24 | D | C | C | B |
| Test 3 | NC = $3 \times 10^{13}$, V = 0.50, V/G = 0.17 | C | B | B | A |
| Test 4 | NC = $3 \times 10^{13}$, V = 0.38, V/G = 0.13 | B | A | A | A |

TABLE 1-continued

| | | Heat treatment conditions | | | |
|---|---|---|---|---|---|
| Test No. | Single crystal pulling conditions | Temperature = 1200° C. Time = 1 Hr | Temperature = 1200° C. Time = 4 Hr | Temperature = 1230° C. Time = 1 Hr. | Temperature = 1250° C. Time = 1 Hr |
| Test 5 | NC = 1 × 10$^{15}$, V = 0.80, V/G = 0.27 | B | A | A | A |

Note:
(1) Solid-liquid interface temperature gradient G = 2.94 K/mm (constant)
(2) NC: nitrogen concentration [/cm$^3$]
(3) V: pulling rate [mm/min]
4) V/G: parameter [mm$^2$/K.min]
5)
Depth of COP free
d ($\mu$m)         Notation
d < 1              D
d ≈ 3              C
3 < d < 6          B
d ≥ 6              A From the result shown in Table 1, it can be seen that, in order to produce a silicon single crystal wafer having a defect-free layer containing no COP with a sufficient depth (at least 3 $\mu$m) as a surface layer by subjecting a silicon single crystal wafer having a relatively low nitrogen concentration of about 3×10$^{13}$ and a diameter of 300 mm or more to the heat treatment at 1200° C. for 1 hour, a silicon single crystal can be pulled first with controlling the pulling rate V and the solid-liquid interface temperature gradient G so that the V/G value should become 0.17 mm$^2$/K·min or less to reduce the COP size. Further, as for the heat treatment temperature, it was found that, if it is 1250° C. or higher, a depth of the defect-free layer exceeding 3 $\mu$m can be obtained with the heat treatment of 1 hour even with V/G of more than 0.17 and a relatively low nitrogen concentration (3×10$^{13}$), and if it is 1230° C., a depth of about 3 $\mu$m of the defect-free layer can be obtained by the heat treatment of 1 hour. Further, it can be seen that, if a wafer sliced from a single crystal grown with a V/G value of 0.17 mm$^2$/K·min or less is subjected to the heat treatment at 1230° C. or higher for 1 hour or more under an inert gas atmosphere, there can be produced even a highly functional heat-treated wafer of high quality having a defect-free layer containing no COP for a depth of 6 microns or more from a wafer surface.

Furthermore, it was also confirmed that, even if the heat treatment was performed by using a heat treatment atmosphere of 100% of hydrogen gas or a mixed gas atmosphere of hydrogen and argon, results similar to those shown in Table 1 could be obtained.

The present invention is not limited to the embodiments described above. The above-described embodiments are mere examples, and those having the substantially same configurations as that described in the appended claims and providing the similar functions and advantages are all included in the scope of the present invention.

For example, diameter of a silicon wafer to which the method of the present invention can be applied is not limited to 300 mm. This is because, according to the method of the present invention, a deeper defect-free layer can be obtained by using a V/G value of 0.17 or less to reduce the COP size and the subsequent heat treatment irrespective of the wafer diameter. That is, the V/G value is a parameter that can be used irrespective of the diameter of a silicon single crystal, and the method of the present invention has an advantage that it can also be used for a wafer of a further larger diameter used in future, for example, a diameter of 400 mm, 500 mm or more.

What is claimed is:

1. A silicon single crystal wafer having a diameter of 300 mm or more and having a defect-free layer containing no COP for a depth of 3 microns or more from a surface.

2. A method for producing a silicon single crystal, wherein, when a silicon single crystal having a diameter of 300 mm or more is pulled with nitrogen doping by the Czochralski method, the crystal is grown with a value of V/G [mm2/K min] of 0.17 or less, where V [mm/mm] is a pulling rate, and G [K/mm] is an average of temperature gradient in the crystal along a pulling axis from the melting point of silicon to 1400° C.

3. A method for producing a silicon single crystal according to claim 2, wherein the crystal is grown with a nitrogen concentration of 1×10$^{13}$/cm$^3$ or more for the nitrogen doping.

4. A method for producing a silicon single crystal wafer in which a nitrogen-doped silicon single crystal wafer having a diameter of 300 mm or more is subjected to heat treatment, wherein the wafer is subjected to the heat treatment at 1230° C. or more for 1 hour or more under an atmosphere of inert gas, hydrogen or a mixed gas thereof.

5. A method for producing a silicon single crystal wafer, wherein, when a silicon single crystal having a diameter of 300 mm or more is pulled with nitrogen doping by the Czochralski method, the crystal is grown with a value of V/G [mm$^2$/K·min ] of 0.17 or less. where V [mm/min] is a pulling rate, and G [K/mm] is an average of temperature gradient in the crystal along a pulling axis from the melting point of silicon to 1400° C., and wherein a silicon single crystal wafer obtained by slicing a silicon single crystal wafer produced thereby is subjected to the heat treatment defined in claim 4.

6. A method for producing a silicon single crystal wafer, wherein, when a silicon single crystal having a diameter of 300 mm or more is pulled with nitrogen doping by the Czochralski method, the crystal is grown with a value of V/G [mm$^2$.K·min] of 0.17 or less, where V [mm/min] is a pulling rate, and G [K/min] is an average of temperature gradient in the crystal along a pulling axis from the melting point of silicon to 1400° C., wherein the crystal is grown with a nitrogen concentration of 1×10$^{13}$/cm$^3$ or more for the nitrogen doping, and wherein a silicon single crystal wafer obtained by slicing a silicon single crystal produced thereby is subjected to the heat treatment defined in claim 4.

* * * * *